United States Patent
Makabe et al.

(10) Patent No.: US 6,794,258 B2
(45) Date of Patent: Sep. 21, 2004

(54) HIGH-PERFORMANCE MOS TRANSISTOR OF LDD STRUCTURE HAVING A GATE INSULATING FILM WITH A NITRIDE CENTRAL PORTION AND OXIDE END PORTIONS

(75) Inventors: Mariko Makabe, Tokyo (JP); Shin Koyama, Tokyo (JP); Koichi Ando, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/606,294

(22) Filed: Jun. 26, 2003

(65) Prior Publication Data

US 2004/0026752 A1 Feb. 12, 2004

Related U.S. Application Data

(62) Division of application No. 09/824,672, filed on Apr. 4, 2001.

(30) Foreign Application Priority Data

Apr. 5, 2000 (JP) ........................................ 2000-103621

(51) Int. Cl.⁷ ............................................ H01L 21/336
(52) U.S. Cl. ................... 438/287; 438/299; 438/301; 438/303; 438/305; 438/306; 438/591; 438/595
(58) Field of Search .................................. 438/287, 591

(56) References Cited

U.S. PATENT DOCUMENTS

| | | | |
|---|---|---|---|
| 3,764,865 A | * 10/1973 | Napoli et al. ............... 257/283 |
| 3,886,584 A | 5/1975 | Cook, Jr. et al. |
| 3,906,620 A | * 9/1975 | Anzai et al. ............... 438/287 |
| 4,343,078 A | 8/1982 | Miyagi |
| 5,219,773 A | 6/1993 | Dunn |
| 5,369,297 A | 11/1994 | Kusunoki et al. |
| 5,898,207 A | * 4/1999 | Takase et al. ............... 257/368 |
| 5,994,747 A | * 11/1999 | Wu ............................. 257/408 |
| 6,057,217 A | 5/2000 | Uwasawa |
| 6,057,582 A | 5/2000 | Choi |
| 6,069,041 A | 5/2000 | Tanigami et al. |
| 6,097,069 A | 8/2000 | Brown et al. |
| 6,207,485 B1 | 3/2001 | Gardner et al. |
| 6,211,045 B1 | 4/2001 | Liang et al. |
| 6,221,708 B1 | 4/2001 | Gonzalez et al. |
| 6,225,669 B1 | 5/2001 | Long et al. |
| 6,232,187 B1 | 5/2001 | Kuroi et al. |
| 6,271,094 B1 | 8/2001 | Boyd et al. |
| 6,287,917 B1 | 9/2001 | Park et al. |
| 6,291,865 B1 | 9/2001 | Lee |
| 6,335,549 B1 | 1/2002 | Kusunoki et al. |
| 6,348,385 B1 | 2/2002 | Cha et al. |
| 6,352,885 B1 | * 3/2002 | Wieczorek et al. ........ 438/197 |
| 6,429,496 B1 | * 8/2002 | Li et al. .................... 257/411 |
| 6,436,774 B1 | 8/2002 | Lee et al. |
| 6,492,695 B2 | * 12/2002 | Lutze ......................... 257/410 |
| 6,495,890 B1 | * 12/2002 | Ono ........................... 257/387 |
| 6,498,374 B1 | 12/2002 | Ohuchi |
| 6,509,612 B2 | 1/2003 | Clevenger et al. |
| 6,514,808 B1 | * 2/2003 | Samavedam et al. ...... 438/197 |
| 2002/0028555 A1 | 3/2002 | Boyd et al. |
| 2002/0089022 A1 | 7/2002 | Lutze |

FOREIGN PATENT DOCUMENTS

| | | |
|---|---|---|
| JP | 10-200096 A | 7/1998 |
| JP | 10-313114 | 11/1998 |
| JP | 11-307774 | 11/1999 |

* cited by examiner

Primary Examiner—John F. Niebling
Assistant Examiner—Angel Roman
(74) Attorney, Agent, or Firm—McGinn & Gibb, PLLC

(57) ABSTRACT

A metal oxide Semiconductor (MOS) transistor includes a gate insulating film disposed on a surface of a silicon substrate. The gate insulating film has a central portion formed on the silicon substrate and comprising a nitride insulating film, and an end portion located on each side of the central portion, the end portion being thicker than the central portion and formed of an oxide insulating film. The MOS transistor also includes a p-type gate electrode formed on the gate insulating film, sidewalls formed on both sides of the gate insulating film and the gate electrode, a pair of p-type source/drain areas formed in surface portions of the silicon substrate, and a channel area located between the pair of source/drain areas.

8 Claims, 9 Drawing Sheets

HIGH-PERFORMANCE MOS TRANSISTOR OF LDD STRUCTURE HAVING A GATE INSULATING FILM WITH A NITRIDE CENTRAL PORTION AND OXIDE END PORTIONS

The present Application is a Divisional Application of U.S. patent application Ser. No. 09/824,672, filed on Apr. 4, 2001.

BACKGROUND OF THE INVENTION

1. Field of the Invention

The present invention relates to a p-type MOS (Metal Oxide Semiconductor) transistor of LDD (Lightly Doped Drain-Source) structure and a manufacturing method thereof.

2. Description of the Related Art

Typical MOS transistors currently used in logic circuits and the like have an LDD structure as shown in FIG. 1. Specifically, p-type MOS transistor 100 of LDD structure illustrated in FIG. 1 is configured such that gate insulating film 102 in a predetermined pattern is disposed on the surface of n-type silicon substrate 101, p-type gate electrode 103 is disposed thereon, and sidewalls 104 are formed on both sides of gate insulating film 102 and gate electrode 103. Deeply doped p-type source/drain areas 105 are formed in the surface portions of silicon substrate 101 on the outer sides of the portions on which sidewalls 104 are formed. Lightly doped p-type source/drain areas 106 are formed in the surface portions of silicon substrate 101 on the inner sides of the deeply doped p-type source/drain areas 105. Channel area 107 is interposed between paired lightly doped p-type source/drain areas 106.

In the configuration, the interface between gate insulating film 102 and each sidewall 104 is close to the interface between channel area 107 and each source/drain area 106. That is, MOS transistor 100 is configured such that the plane corresponding to the interface between gate insulating film 102 and each sidewall 104 substantially coincides with or opposite in close proximity to the plane corresponding to the interface between channel area 107 and each source/drain area 106.

Since MOS transistor 100 configured as mentioned above has an LDD structure in which lightly doped source/drain areas 106 are located on the inner sides of deeply doped source/drain areas 105, it can restrict the occurrence of hot carriers and prevent a reduction in breakdown voltage.

In the aforementioned MOS transistor 100, gate insulating film 102 is formed of a silicon thermal oxidation film formed on the surface of silicon substrate 101, and source/drain areas 105, 106 and gate electrode 103 include a p-type impurity such as boron ion-implanted therein for allowing them to serve as p-channels.

A method of manufacturing MOS transistor 100 as described above is simply described in the following.

The surface of silicon substrate 101 is first subjected to thermal treatment to form a silicon thermal oxidation film on the entire surface. Gate electrode 103 in a predetermined pattern is formed on the surface of the silicon thermal oxidation film. Dry etching is performed on the silicon thermal oxidation film with gate electrode 103 used as a mask. The etching removes the portion of the silicon thermal oxidation film on the surface of silicon substrate 101 which is not masked by gate electrode 103. The silicon thermal oxidation film remaining under gate electrode 103 is to serve as gate insulating film 102.

Next, a p-type impurity is ion-implanted into gate electrode 103 to make gate electrode 103 p-type. A p-type impurity is ion-implanted into the silicon substrate at the positions where lightly doped source/drain areas 106 are to be formed and then annealing is performed for activation, thereby forming lightly doped source/drain areas 106. Sidewalls 104 are formed on both sides of gate insulating film 102 and gate electrode 103 on the surface of the portions in silicon substrate 101 where source/drain areas 106 are formed. Finally, a p-type impurity is ion-implanted in the surface portions of silicon substrate 101 with sidewalls 104 used as masks and annealing is performed for activation to form deeply doped source/drain areas 105. In this manner, p-type MOS transistor 100 of LDD structure is completed.

In the aforementioned transistor manufacturing method, lightly doped source/drain areas 106 are formed by implanting the p-type impurity into the surface portions of silicon substrate 101 with gate electrode 103 used as a mask and performing annealing, and deeply doped source/drain areas 105 are formed by implanting the p-type impurity into the surface portions of silicon substrate 101 with sidewalls 104 used as masks and performing annealing. Thus, it is possible to simply and reliably form the LDD structure including lightly doped source/drain areas 106 and deeply doped source/drain areas 105.

In the aforementioned p-type MOS transistor 100, however, when the impurity is implanted into silicon substrate 101 and then the annealing is performed to form source/drain areas 105, 106, the p-type impurity implanted into gate electrode 103 may be diffused even to channel area 107 in silicon substrate 101 through gate insulating film 102. In this case, since channel area 107 in silicon substrate 101 which should be of n-type becomes p-type, the performance of p-type MOS transistor 100 is degraded.

To solve the problem, Japanese Patent Laid-open Publication No. 313114/98, for example, discloses a MOS transistor in which a gate insulating film is formed of a silicon oxynitride film to prevent a p-type impurity from being diffused to a channel area from a gate electrode.

The present inventors, however, have found, from actual manufacturing of a p-type MOS transistor having a gate insulating film formed of a silicon oxynitride film, that while it can prevent the diffusion of a p-type impurity from a gate electrode to a channel area, BT (Bias Temperature) characteristics show more degradation than that of one having a gate insulating film formed of a silicon thermal oxidation film. Studies to find a cause have revealed that the silicon oxynitride film contains positive fixed charge therein from the time of film formation, and the amount of the accumulated positive fixed charge is significantly increased due to BT stress to readily increase of the interface state density. Thus, a p-type MOS transistor having a gate insulating film formed of a silicon oxynitride film is susceptible to degradation of BT characteristics such as a shift of threshold voltage or degradation of on-state current.

In addition, detailed analysis of the BT characteristics have shown that a shift of threshold voltage or degradation of on-state current tends to occur due to fixed charge on both end portions of the gate insulating film close to source/drain areas, and the BT characteristics are affected to a lesser extent in the central portion of the gate insulating film away from the source/drain areas.

Accordingly, it is possible to prevent diffusion of a p-type impurity from a gate electrode to a channel area in a p-type MOS transistor and degradation of BT characteristics by forming the central portion of a gate insulating film of a silicon oxynitride film and forming each of both end portions of a silicon thermal oxidation film. A p-type MOS transistor of such structure is disclosed, for example, in Japanese Patent Laid-open Publication No. 102482/93. The p-type MOS transistor disclosed in the Laid-open publication has a structure including overlapping gate electrode and source/drain areas, in which the central portion of the gate insulating film is formed of a silicon oxynitride film while both end portions of the gate insulating film are each formed of a silicon thermal oxidation film. More (specifically, as shown in FIG. 2, p-type MOS transistor 120 disclosed in the aforementioned Laid-open publication has gate insulating film 122 and p-type gate electrode 123 disposed in turn on the surface of n-type silicon substrate 121. Gate insulating film 122 is formed of silicon oxynitride film 128 only in the central portion, and formed of silicon thermal oxidation film 129 in each of both end portions. P-type deeply doped source/drain areas 125 and p-type lightly doped source/drain areas 126 are formed in the surface portions of silicon substrate 121. Deeply doped source/drain areas 125 are primarily formed at the positions on the outer sides of gate electrode 123, while lightly doped source/drain areas 126 are formed at the positions on the outer sides of silicon oxynitride film 128 which is the central portion of gate insulating film 122. Channel area 127 is formed only under silicon oxynitride film 128 which is the central portion of gate insulating film 122. Sidewalls are formed on neither side of gate insulating film 122 and gate electrode 123, and interlayer insulating film 124 in the shape of an inverted U is formed to cover the top surface and sides surfaces of gate electrode 123.

Since p-type MOS transistor 120 of the aforementioned structure has overlapping lightly doped source/drain areas 126 and gate electrode 123, the occurrence of hot carriers can be restrained in the LDD structure. In addition, since both end portions of gate insulating film 122 located over lightly doped source/drain areas 126 are each formed of silicon thermal oxidation film 129, degradation of BT characteristics can be prevented. Furthermore, since the central portion of gate insulating film 122 located over channel area 127 is formed of silicon oxynitride film 128, it is possible to prevent diffusion of the p-type impurity from gate electrode 123 to silicon substrate 121.

Simple description is hereinafter made for a method of manufacturing the aforementioned MOS transistor 120. Silicon thermal oxidation film 129 is first formed on the surface of silicon substrate 121. A polysilicon mask (not shown) in a predetermined pattern is disposed on silicon thermal oxidation film 129 and nitriding is performed thereon. Only the portion of silicon thermal oxidation film 129 not covered with the polysilicon mask is nitrided to form silicon oxynitride film 128. Silicon thermal oxidation film 129 covered with the polysilicon mask is not nitrided but remains as it is.

Next, the polysilicon mask is removed to form gate electrode 123. A p-type impurity is ion-implanted into silicon substrate 121 at the positions where deeply doped source/drain areas 125 are to be formed with gate electrode 123 used as a mask. Interlayer insulating film 124 is formed in the shape of an inverted U to cover the top surface and side surfaces of gate electrode 123. Then, the entirety is heated to high temperature for annealing. The p-type impurity included in gate electrode 123 is diffused to the positions where lightly doped source/drain areas 126 are to be formed through silicon thermal oxidation film 129 and the impurities diffused to silicon substrate 121 are activated to complete deeply doped and lightly doped source/drain areas 125, 126.

In the transistor manufacturing method, however, process control is extremely difficult as compared with typical ion implantation since the p-type impurity in gate electrode 123 is diffused to silicon substrate 121 to form lightly doped source/drain areas 126.

It is difficult to independently control diffusion of an impurity in a vertical direction (depth direction) and a horizontal direction (width direction). In other words, diffusion in the vertical direction and diffusion in the horizontal direction proceed in substantially the same degrees. Thus, when the diffusion of the impurity is used to form lightly doped source/drain areas 126 as described above, each of the areas has a width in the horizontal direction substantially equal to a depth in the vertical direction, and thus it is impossible to freely form lightly doped source/drain areas in arbitrary shapes, thereby possibly causing the inability to form lightly doped source/drain areas in desired ideal shapes.

In addition, since the p-type impurity in gate electrode 123 is diffused to silicon substrate 121 as described above, it is difficult to control such that the p-type impurity in gate electrode 123 has a proper concentration after the diffusion. Thus, excessive or insufficient impurity concentrations readily occur in lightly doped source/drain areas 126 and gate electrode 123 to make it difficult to obtain optimal impurity concentrations in both of them.

In the aforementioned method, the polysilicon mask is used for partially nitriding silicon thermal oxidation film 129 to form silicon oxynitride film 128. In the method, however, damage due to etching is caused in the central portion of gate insulating film 122 when patterning is performed with the polysilicon mask, and damage is caused on the entire surface of gate insulating film 122 when the polysilicon mask is removed.

Most of the aforementioned problems become serious as the scale of integration is increased in MOS transistor 120. Therefore, it is not a practical idea to manufacture MOS transistor 120 using the circuit manufacturing method described in the aforementioned Laid-open publications at current factories where high-integration circuit products are mass-manufactured.

SUMMARY OF THE INVENTION

In view of the aforementioned problems, it is an object of the present invention to provide a p-type MOS transistor capable of preventing diffusion of a p-type impurity in a gate electrode to a silicon substrate and preventing degradation of BT characteristics, and a manufacturing method thereof.

A MOS transistor of the present invention comprises a gate insulating film disposed on the surface of a silicon substrate, a p-type gate electrode formed on the gate insulating film, and sidewalls formed on both sides of the gate insulating film and the gate electrode. A pair of p-type source/drain areas is provided in surface portions of the silicon substrate, and a channel area is located between the source/drain areas. The gate insulating film comprises a central portion formed of a nitride insulating film containing at least nitrogen and both end portions located on both sides of the central portion and each formed of an oxide insulating film containing oxygen and no nitrogen.

With the configuration, the nitride insulating film of the gate insulating film can prevent the p-type impurity doped into the gate electrode from being diffused to the silicon substrate during thermal treatment. Since the portions of the gate insulating film in contact with the source/drain areas are each formed of the oxide insulating film, degradation of BT characteristics can be prevented. In addition, the source/ drain areas can be formed in desired shapes and at desired concentrations of doping to achieve favorable characteristics of the transistor.

The LDD structure may be adopted, whose source/drain areas comprise lightly doped source/drain areas located on inner sides in contact with the channel area and deeply doped source/drain areas located on the outer sides of the lightly doped source/drain areas. In this case, the deeply doped source/drain areas and lightly doped source/drain areas can be simply formed by using the sidewalls.

The oxide insulating film thicker than the nitride insulating film allows favorable functions as the LDD structure and more reliably prevents degradation of BT characteristics. The nitride insulating film may be formed of a silicon oxynitride film and the oxide insulating film may be formed of a silicon thermal oxidation film.

The integral formation of the oxide insulating film and the sidewalls can simplify the manufacturing steps and provide satisfactory productivity since the oxide insulating film and the sidewalls need not be formed individually. It is preferable that the interface between the gate insulating film and each sidewall is close to the interface between the channel area and each source/drain area.

It is also preferable that the interface between the nitride insulating film and each oxide insulating film is close to the interface between the channel area and each source/drain area.

In addition, preferably, the interface between each lightly doped source/drain area and each deeply doped source/drain area is close to each outer side surface of the sidewalls.

Such a MOS transistor can be manufactured by forming a nitride insulating film on a surface of silicon substrate, forming a gate electrode in a predetermined pattern on a surface of the nitride insulating film, performing wet etching of the nitride insulating film with the gate electrode used as a mask, forming an oxide insulating film thicker than the nitride insulating film under each of both end portions of the gate electrode where the nitride insulating film is removed, forming lightly doped source/drain areas in surface portions of the silicon substrate with the gate electrode used as a mask, forming sidewalls on the lightly doped source/drain areas, and forming deeply doped source/drain areas in surface portions of the silicon substrate with the sidewalls used as masks.

By this method, the oxide insulating film thicker than the nitride insulting film can be readily formed, and the MOS transistor of the LDD structure as mentioned above can be easily manufactured.

Alternatively, after the wet etching of the nitride insulating film, lightly doped source/drain areas may be formed in surface portions of the silicon substrate with the gate electrode used as a mask, by a CVD method sidewalls may be formed on the source/drain areas and an oxide insulating film is formed integrally with the sidewalls under each of both end portions of the gate electrode where the nitride insulating film is removed, and then deeply doped source/ drain areas may be formed in surface portions of the silicon substrate with the sidewalls used as masks.

The step of performing wet etching preferably removes a portion of the nitride insulating film not masked by the gate electrode and removes portions of the nitride insulating film under both end portions of the gate electrode.

The above and other objects, features and advantages of the present invention will become apparent from the following description with reference to the accompanying drawings which illustrate examples of the present invention.

DESCRIPTION OF THE PREFERRED EMBODIMENTS

Figure 1:
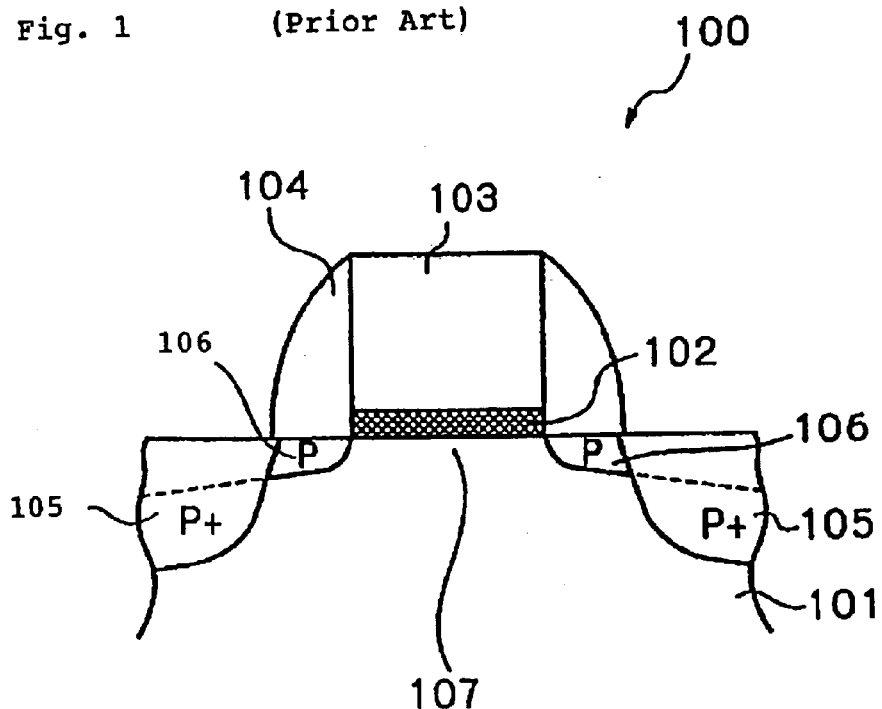
FIG. 1 is a vertical section front view schematically showing the internal structure of a conventional MOS transistor.
Figure 2:
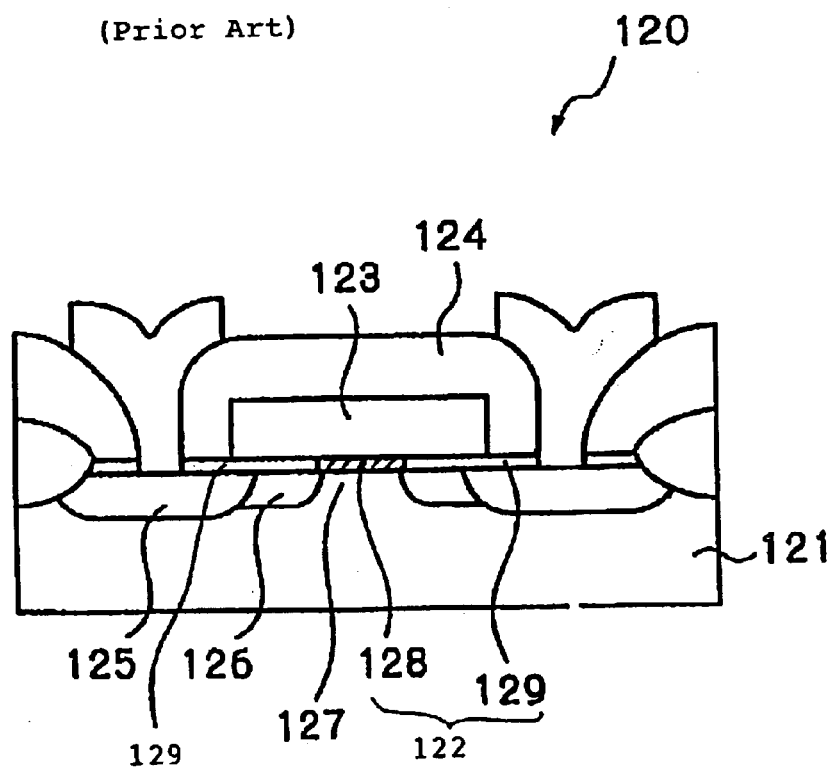
FIG. 2 is a vertical section front view schematically showing the internal structure of another conventional MOS transistor.
Figure 3:
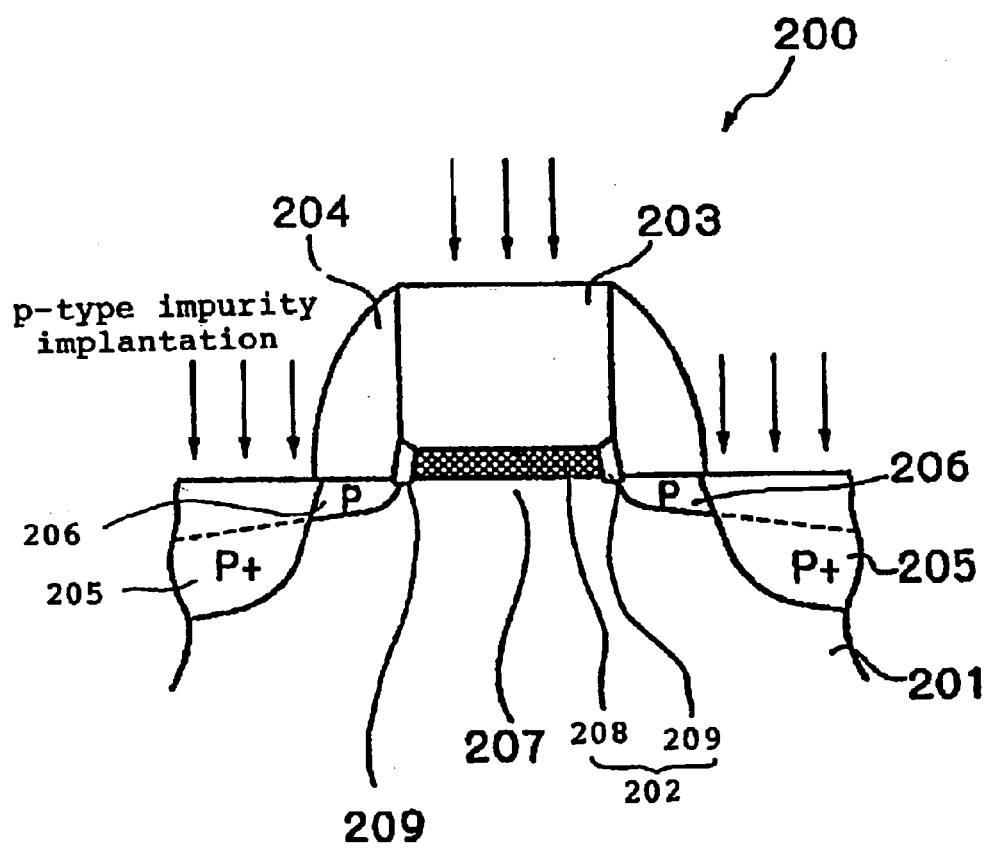
FIG. 3 is a vertical section front view schematically showing the internal structure of a MOS transistor according to a first embodiment of the present invention.

A first embodiment of the present invention is hereinafter described with reference to FIGS. 3 to 7. P-type MOS transistor 200 of the embodiment is configured such that gate insulating film 202 in a predetermined pattern and p-type gate electrode 203 are disposed in turn on the surface of n-type silicon substrate 201 and sidewalls 204 are formed on both sides of gate insulating film 202 and gate electrode 203, as shown in FIG. 3, similarly to conventional MOS transistor 100 (see FIG. 1) described above.

Deeply doped p-type source/drain areas 205 are formed in the surface portions of silicon substrate 201 on the outer sides of the portions on which sidewalls 204 are formed. Lightly doped source/drain areas 206 are formed in surface portions of silicon substrate 201 on the inner sides of deeply doped source/drain areas 205. Channel area 207 is interposed between paired lightly doped p-type source/drain areas 206. The interface between gate insulating film 202 and each sidewall 204 is close to the interface between channel area 207 and each source/drain area 206.

P-type MOS transistor 200 of the embodiment has gate insulating film 202 comprising the central portion formed of silicon oxynitride film 208 which is a nitride insulating film and both end portions each formed of silicon thermal oxidation film 209 which is an oxide insulating film located on each side of the central portion, unlike conventional MOS transistor 100. Silicon thermal oxidation film 209 of gate insulating film 202 is formed to be thicker than silicon oxynitride film 208, and the interface between each lightly doped source/drain area 206 and channel area 207 is located under each silicon thermal oxidation film 209.

In p-type MOS transistor 200 of the embodiment, lightly doped source/drain areas 206 are located on the inner sides of deeply doped source/drain areas 205, and gate insulating film 202 and gate electrode 203 overlap lightly doped source/drain areas 206, thereby making it possible to function as an LDD structure.

Figure 4:
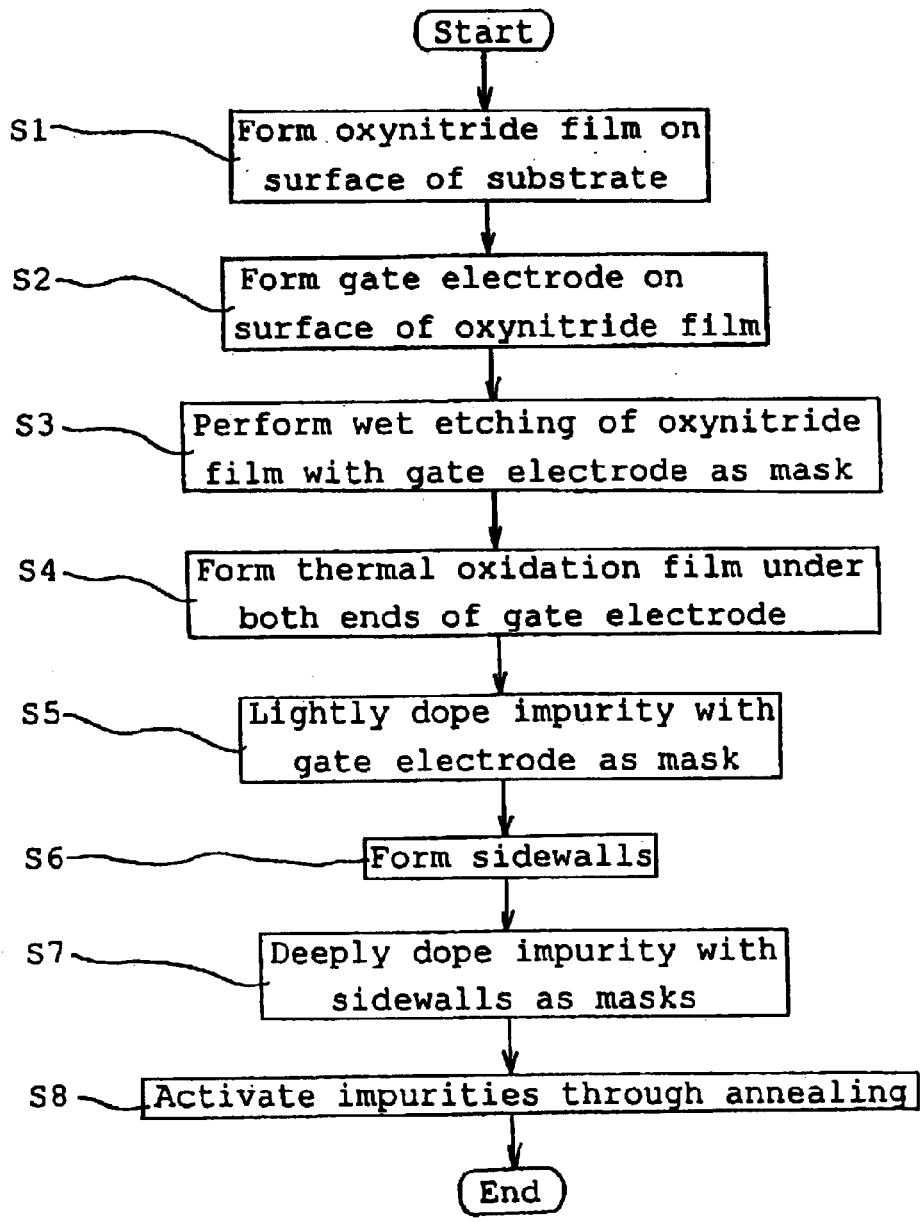
FIG. 4 is a flow chart for describing a manufacturing method of the transistor of the first embodiment.
Figure 5A:
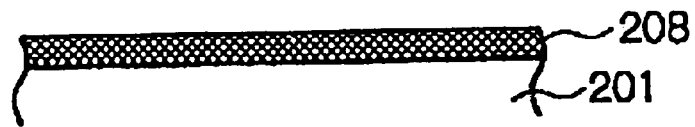
FIG. 5A is a vertical section front view showing a manufacturing step of the transistor of the first embodiment.
Figure 5B:
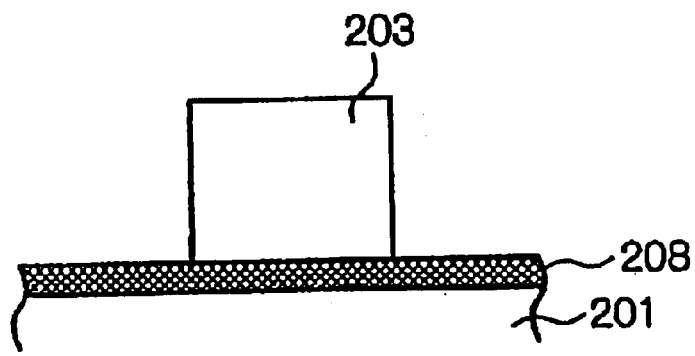
FIG. 5B is a vertical section front view showing a manufacturing step of the transistor of the first embodiment.

Simple description is hereinafter made for a method of manufacturing MOS transistor 200 of the embodiment with reference to the flow chart in FIG. 4. First, as shown in FIG. 5A, silicon oxynitride film 208 with a thickness of approximately 19 (Å) is formed on the entire surface of silicon substrate 201 (step S1). Next, as shown in FIG. 5B, gate electrode 203 made from polysilicon with a thickness of 1500 (Å) is formed in a predetermined pattern on the surface of silicon oxynitride film 208 (step S2).

Figure 5C:
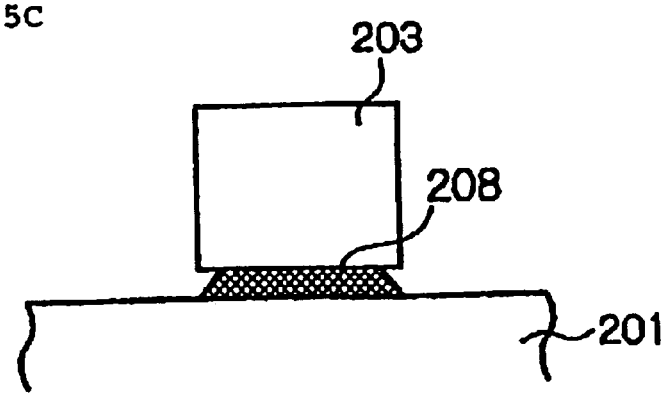
FIG. 5C is a vertical section front view showing a manufacturing step of the transistor of the first embodiment.

Next, silicon oxynitride film 208 is subjected to wet etching with gate electrode 203 used as a mask to remove the portion of silicon oxynitride film 208 which is not masked by gate electrode 203, as shown in FIG. 5C (step S3). The wet etching is performed, for example using BHF (Buffered Hydrogen Fluoride) as an etchant for approximately 30 minutes to remove not only the portion of silicon oxynitride film 208 not covered with gate electrode 203 but also the portions of silicon oxynitride film 208 under both ends of gate electrode 203.

Figure 6A:
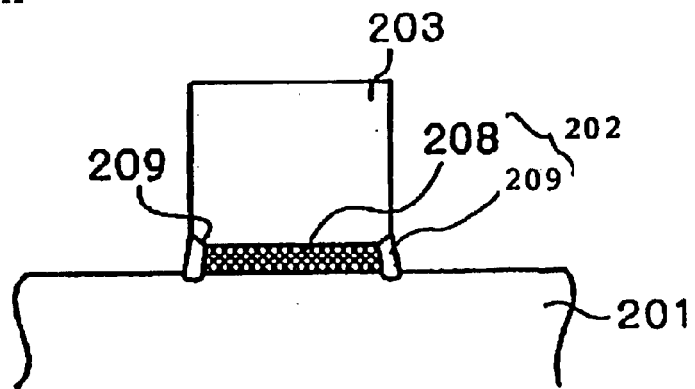
FIG. 6A is a vertical section front view showing a manufacturing step of the transistor of the first embodiment.

Then, as shown in FIG. 6A, silicon thermal oxidation film 209 is formed through thermal oxidation under each of both ends of gate electrode 203 where silicon oxynitride film 208 is removed (step S4). In this manner, gate insulating film 202 including silicon oxynitride film 208 as the central portion and silicon thermal oxidation film 209 as each of both end portions is formed. The thermal oxidation is performed, for example, in an atmosphere of $O_2$ at 850 (° C.) for approximately 10 minutes to form silicon thermal oxidation film 209 at a thickness of approximately 26 (Å). Silicon thermal oxidation film 209 is formed to be thicker than silicon oxynitride film 208 since oxidation occurs simultaneously from the surface side of silicon substrate 201 and from the surface side of gate electrode 203.

Figure 6B:
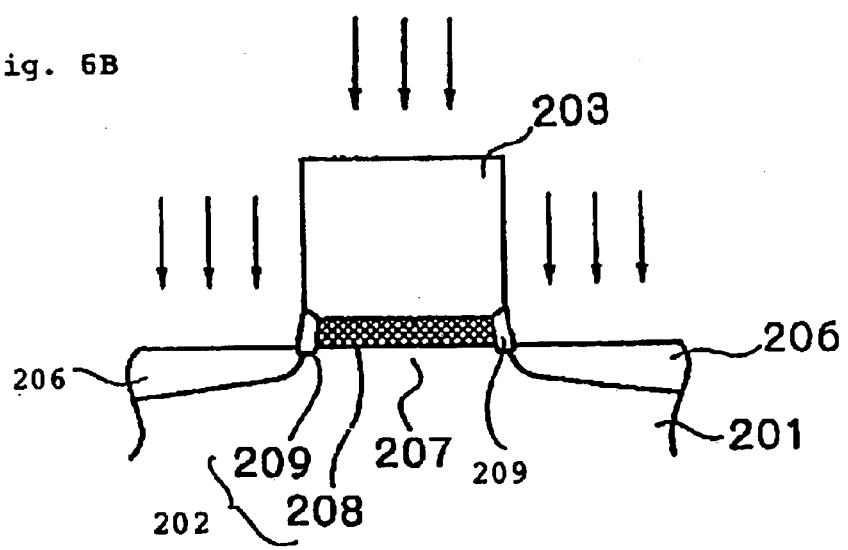
FIG. 6B is a vertical section front view showing a manufacturing step of the transistor of the first embodiment.

Next, as shown in FIG. 6B, boron, which is a p-type impurity, is ion-implanted into gate electrode 203 and at the positions of silicon substrate 201 where lightly doped source/drain areas 206 are to be formed with gate electrode 203 used as a mask at an acceleration voltage of 4.0 (keV) and with a dosage of approximately $5.0 \times 10^{14}$ (atoms/cm$^2$) (step S5).

Figure 6C:
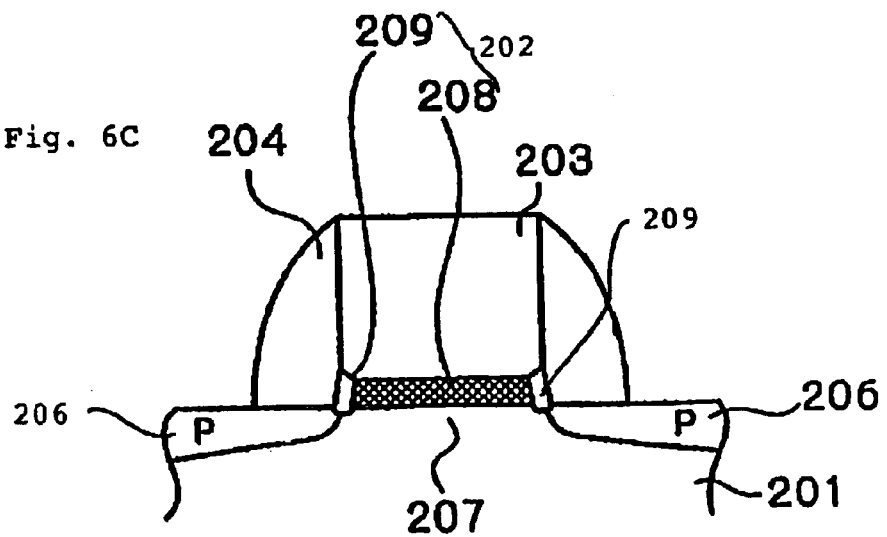
FIG. 6C is a vertical section front view showing a manufacturing step of the transistor of the first embodiment.

Subsequently, a silicon oxide film is formed on the entire surface by a CVD method and etch back is performed to form sidewalls 204 on both sides of gate insulating film 202 and gate electrode 203 as shown in FIG. 6C (step S6). In the aforementioned thermal oxidation step for forming silicon thermal oxidation film 209, an extremely thin thermal oxidation film (not shown) is formed also on the surfaces of the exposed portions of gate electrode 203 and silicon substrate 201. The thin thermal oxidation film, however, presents no problem since it is removed when the etch back is performed after the formation of the silicon oxide film for forming sidewalls 204 as mentioned above.

In addition, as shown in FIG. 3, boron, which is a p-type impurity, is ion-implanted into gate electrode 203 and at the positions of silicon substrate 201 where deeply doped source/drain areas 205 are to be formed and with sidewalls 204 used as masks at an acceleration voltage of 2.0 (keV) and with a dosage of approximately $3.0 \times 10^{15}$ (atoms/cm$^2$) (step S7).

Then, annealing is performed by heating at 1010 (° C.) for approximately 10 minutes (step S8) to activate the impurities which has been ion-implanted into silicon substrate 201, thereby forming lightly doped source/drain areas 206 and deeply doped source/drain areas 205.

As described above, p-type MOS transistor 200 of the embodiment is completed. At a later time, source/drain electrodes (not shown) and the like are formed in MOS transistor 200 through a conventional process to form an integrated circuit device.

In the transistor manufacturing method of the embodiment, the wet etching of silicon oxynitride film 208 with gate electrode 203 used as a mask removes the portions of silicon oxynitride film 208 under both ends of gate electrode 203 simultaneously with the removal of the portion of silicon oxynitride film 208 on the surface of silicon substrate 201 not masked by gate electrode 203, and thick silicon thermal oxidation film 209 is formed through the thermal oxidation at the positions under both ends of gate electrode 203 where silicon oxynitride film 208 is removed. It is thus possible to simply and reliably form gate insulating film 202 including silicon thermal oxidation film 209 in each of both end portions of silicon oxynitride film 208. In addition, silicon thermal oxidation film 209 in each of both end portions of gate insulating film 202 can be formed to be thicker than silicon oxynitride film 208 in the central portion.

In MOS transistor 200 manufactured by the transistor manufacturing method, since the central portion of gate insulating film 202 which is not overlapped by lightly doped source/drain areas 206 is formed of silicon oxynitride film 208, it is possible to prevent the p-type impurity doped into gate electrode 203 from being diffused to silicon substrate 201 during the thermal treatment.

On the other hand, since both end portions of gate insulating film 202 which are overlapped by lightly doped source/drain areas 206 are each formed of silicon thermal oxidation film 209, degradation of BT characteristics such as a shift of threshold voltage or degradation of on-state current can be prevented. Particularly, silicon thermal oxidation film 209 at each of both ends of gate insulating film 202 is thicker than silicon oxynitride film 208 in the central portion and thus is highly effective in preventing degraded BT characteristics.

In the transistor manufacturing method of the embodiment, since the ion implantation steps are performed individually for forming deeply doped source/drain areas 205 and lightly doped source/drain areas 206, doping can be performed at desired concentrations in source/drain areas 205, 206.

The formation of lightly doped source/drain areas 206 requires no diffusion of the impurity in gate electrode 203 to silicon substrate 201. Thus, the impurity in gate electrode 203 can be maintained at a desired concentration to result in favorable characteristics of MOS transistor 200.

In the transistor manufacturing method of the embodiment, the ion implantation is performed for light doping with gate electrode 203 used as a mask, while the ion implantation is performed for deep doping with sidewalls 204 used as masks. It is thus possible to arbitrarily form lightly doped source/drain areas 206 and deeply doped source/drain areas 205 in desired ideal shapes. Therefore, the overlapping portions between gate electrode 203 and source/drain areas 205, 206 do not become too large but they can be formed in an appropriate size, which leads to favorable characteristics of MOS transistor 200.

Figure 7:
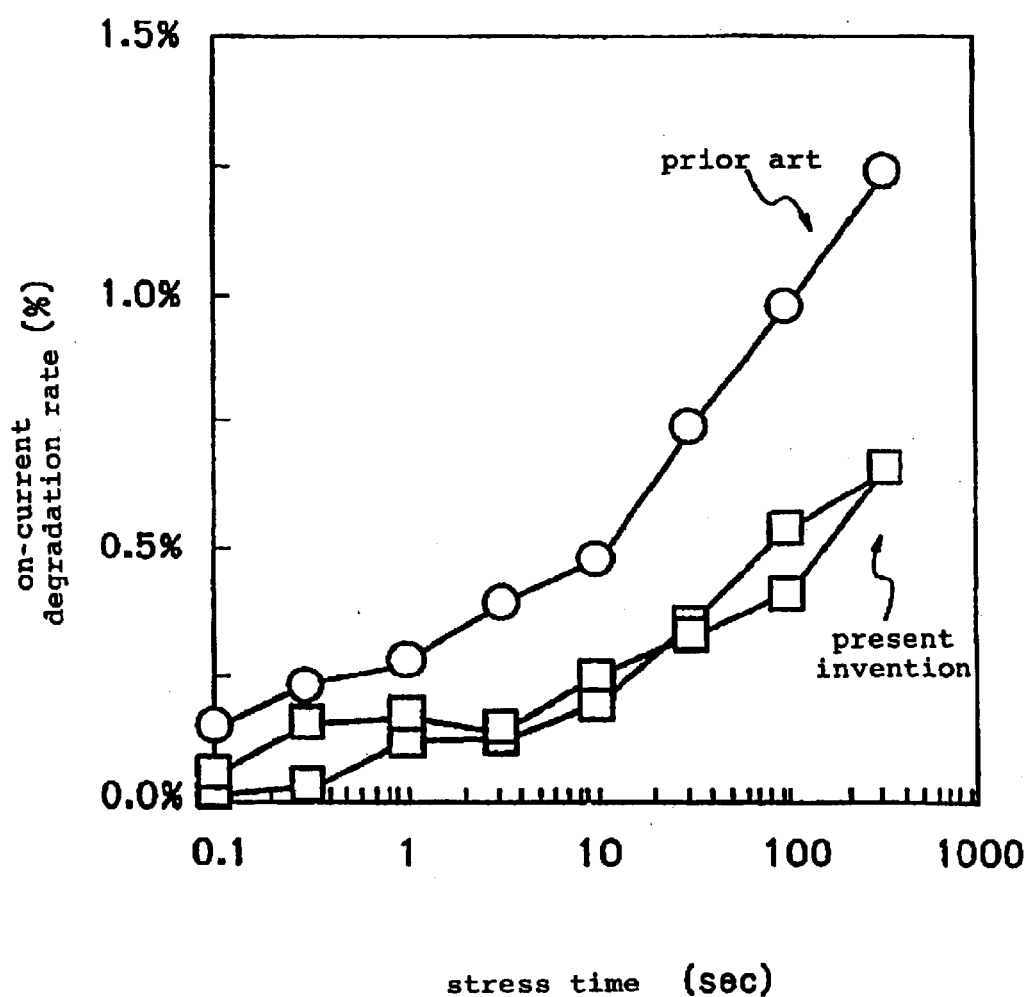
FIG. 7 is a graph showing a comparison of on-state current degradation in the MOS transistor of the first embodiment and the conventional MOS transistor.

The present inventors actually made MOS transistor 200 of the aforementioned embodiment and a MOS transistor 100 of conventionally typical structure and investigated their BT characteristics. The investigation has shown that MOS transistor 200 of the embodiment represented less on-state current degradation as compared with conventional MOS transistor 100 as shown in FIG. 7.

It should be noted that the present invention is not limited to the embodiment, and various modifications are permitted without departing from the gist thereof. For example, while silicon oxynitride film 208 is formed by nitriding the silicon oxide film in the embodiment as an example of the nitride insulating film which is an insulating film containing nitrogen, a silicon nitride film can be formed instead.

In addition, while the interface between each lightly doped source/drain area 206 and channel area 207 is located under each silicon thermal oxidation film 209 in the embodiment, the interface may be located under the interface between each silicon thermal oxidation film 209 and silicon oxynitride film 208, or under both end portions of silicon oxynitride film 208.

Figure 8:
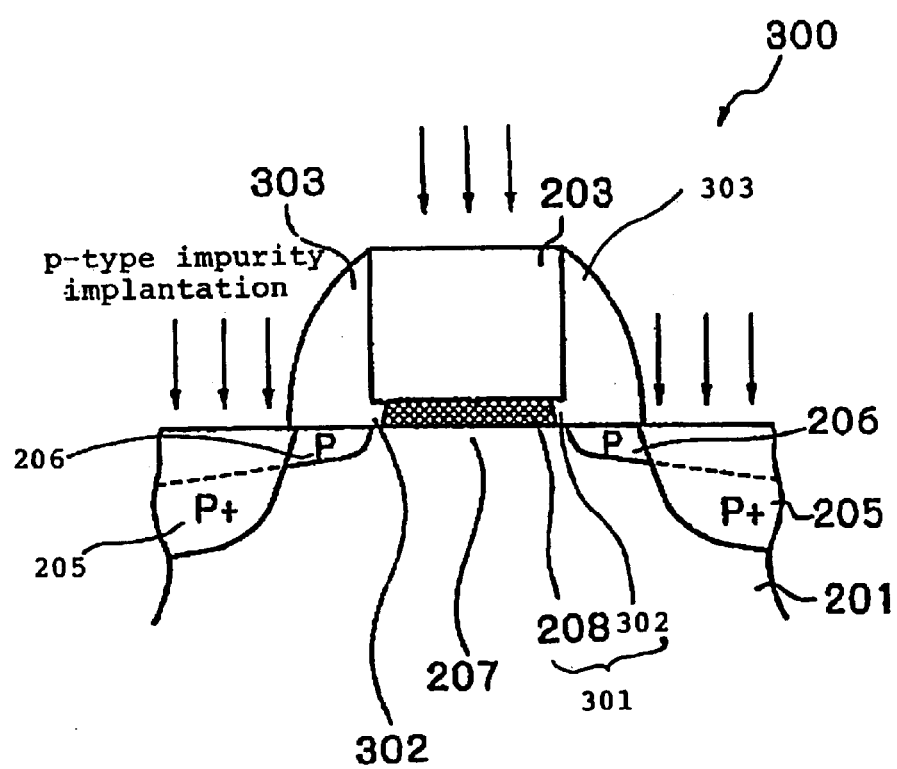
FIG. 8 is a vertical section front view schematically showing the internal structure of a MOS transistor according to a second embodiment of the present invention.
Figure 9:
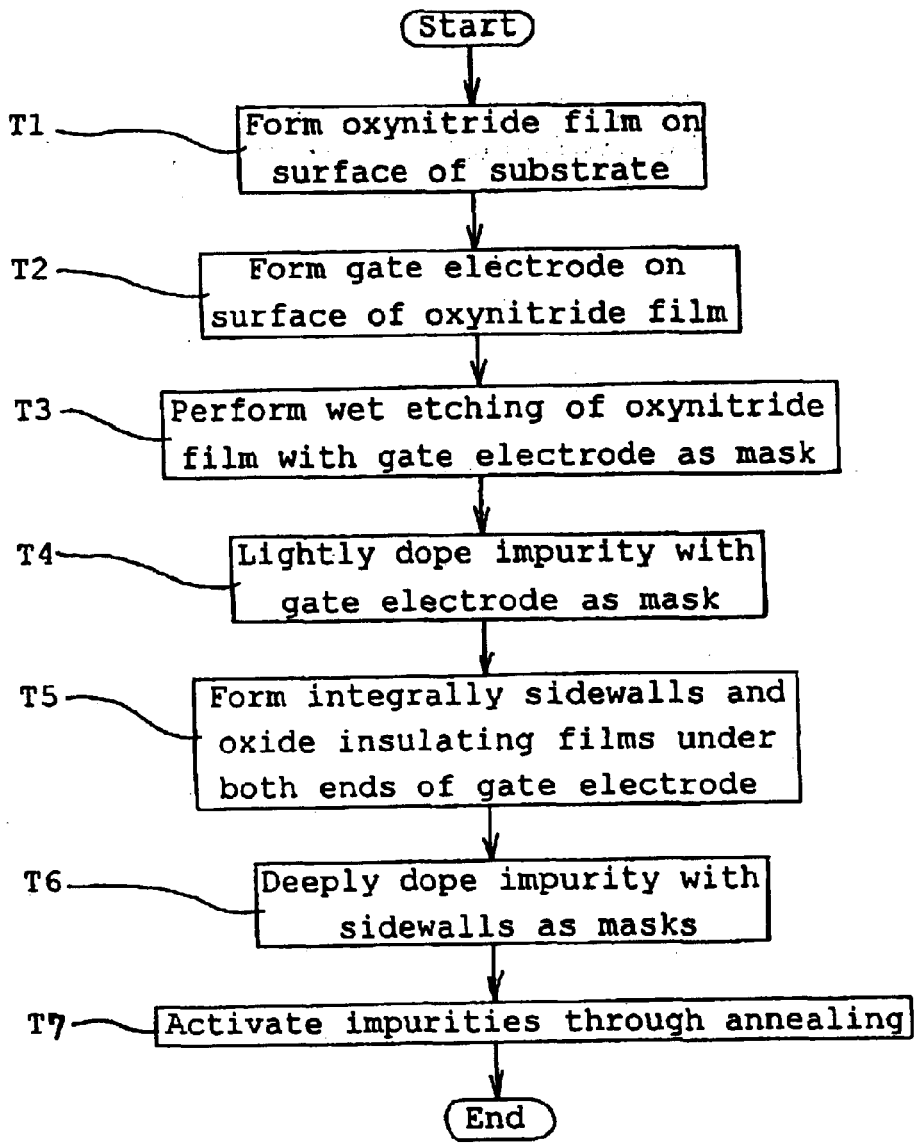
FIG. 9 is a flow chart for describing a manufacturing method of the transistor of the second embodiment.

Next, a second embodiment of the present invention is hereinafter described with reference to FIGS. 8 to 10. The same elements as those in the aforementioned first embodiment are designated with the same names and reference numerals, and detailed description thereof is omitted.

P-type MOS transistor 300 of the embodiment has gate insulating film 301 including the central portion formed of silicon oxynitride film 208 which is a nitride insulating film and both end portions each formed of silicon oxide film 302 which is an oxide insulating film. Silicon oxide film 302 of gate insulating film 301 is formed integrally with sidewalls 303 with the same thickness as that of silicon oxynitride film 208.

Simple description is hereinafter made for a method of manufacturing p-type MOS transistor 300 of the embodiment with reference to the flow chart in FIG. 9. First, silicon oxynitride film 208 is formed at a thickness of approximately 19 (Å) on the entire surface of silicon substrate 201 (step T1). Gate electrode 203 made from polysilicon at a thickness of 1500 (Å) is formed in a predetermined pattern on the surface of silicon oxynitride film 208 (step T2).

Figure 10A:
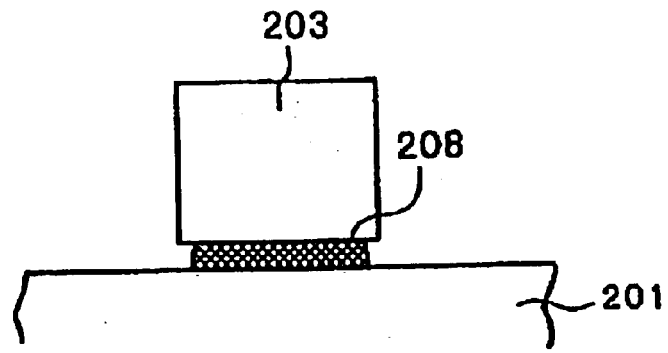
FIG. 10A is a vertical section front view showing a manufacturing step of the transistor of the second embodiment.

Next, silicon oxynitride film 208 is subjected to wet etching with gate electrode 203 used as a mask to remove the portion of silicon oxynitride film 208 on silicon substrate 201 which is not masked by gate electrode 203 and the portions under both end portions of gate electrode 203 as shown in FIG. 10A (step T3).

Figure 10B:
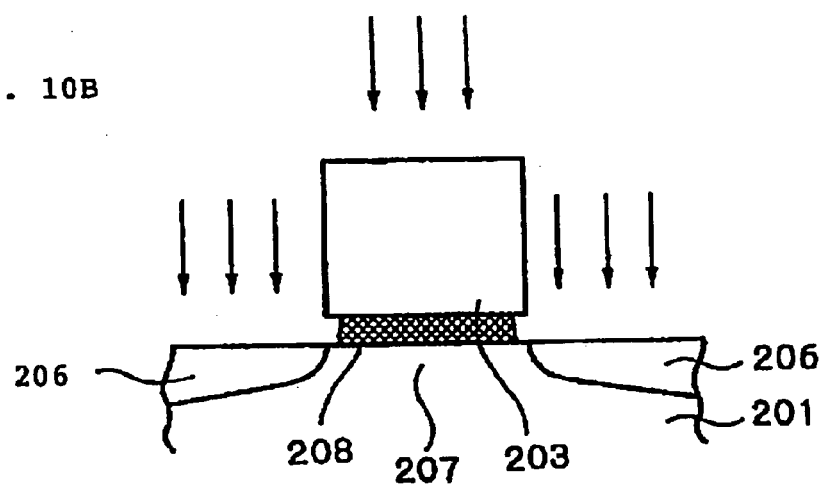
FIG. 10B is a vertical section front view showing a manufacturing step of the transistor of the second embodiment.

Then, as shown in FIG. 10B, boron, which is a p-type impurity, is ion-implanted into gate electrode 203 and at the positions of silicon substrate 201 where lightly doped source/drain areas 206 are to be formed with gate electrode 203 used as a mask at an acceleration voltage of 4.0 (keV) and with a dosage of approximately $5.0 \times 10^{14}$ (atoms/cm$^2$) (step T4).

Figure 10C:
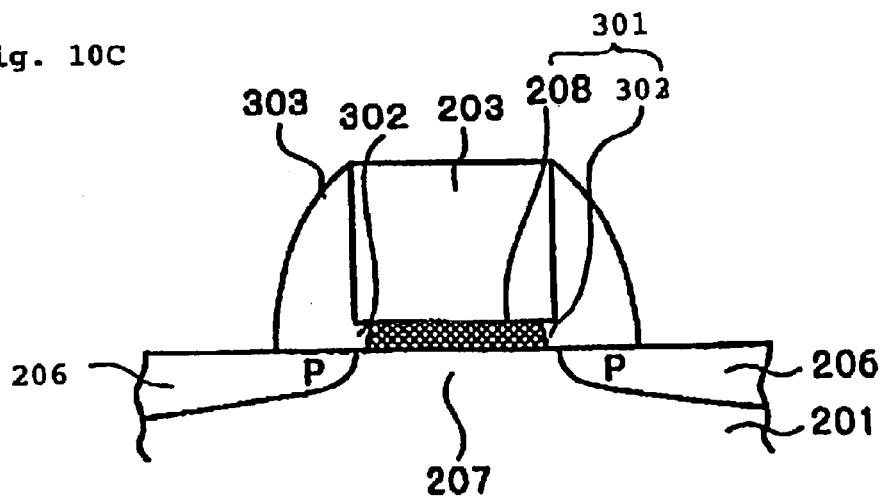
FIG. 10C is a vertical section front view showing a manufacturing step of the transistor of the second embodiment.

Next, a silicon oxide film is formed by the CVD method on the entire surface and etch back is performed to form sidewalls 303 on both sides of gate insulating film 301 and gate electrode 203 as shown in FIG. 10C. Simultaneously, silicon oxide film 302 is filled into voids under both ends of gate electrode 203. In this manner, gate electrode 301 including silicon oxynitride film 208 as the central portion and silicon oxide film 302 as each of both end portions is formed (step T5).

Subsequently, similarly to the aforementioned first embodiment, boron, which is a p-type impurity, is ion-implanted into gate electrode 203 and at the positions of silicon substrate 201 where deeply doped source/drain areas 205 are to be formed with sidewalls 303 used as masks at an acceleration voltage of 2.0 (keV) and with a dosage of approximately $3.0 \times 10^{15}$ (atoms/cm$^2$) (step T6). Annealing is then performed (step T7) to activate the ion-implanted impurity, thereby forming lightly doped source/drain areas 206 and deeply doped source/drain areas 205. In this manner, p-type MOS transistor 300 of the embodiment is completed.

In MOS transistor 300 of the embodiment, since the central portion of gate insulating film 301 is formed of silicon oxynitride film 208, it is possible to prevent the impurity doped into gate electrode 203 from being diffused to silicon substrate 201. In addition, since both end portions of gate insulating film 301 are each formed of silicon oxide film 302, degradation of BT characteristics such as a shift of threshold voltage or degradation of on-state current can be prevented.

In the transistor manufacturing method of the embodiment, similarly to the first embodiment, silicon oxynitride film 208 under both ends of gate electrode 203 can be removed simply and reliably by the wet etching, and the ion implantation is performed individually with gate electrode 203 and sidewalls 204 used as masks. It is thus possible to form lightly doped source/drain areas 206 and deeply doped source/drain areas 206 in desired shapes and at desired concentrations. Also, the impurity in gate electrode 203 can be maintained at a desired concentration.

In the transistor manufacturing method of the embodiment, unlike the aforementioned first embodiment, silicon oxide film 302 is formed integrally with sidewalls 303 under both ends of gate electrode 203 where silicon oxynitride film 208 is removed. This eliminates the need of extra step for forming silicon oxide film 302 in each of both end portions of gate insulating film 301, resulting in further improvement in productivity of MOS transistor 300.

In addition, since silicon oxide film 302 and sidewalls 303 are integrally formed by the CVD method in the transistor manufacturing method of the embodiment, silicon oxide film 302 can be formed in desired composition irrespective of thermal oxidation, thereby obtaining favorable characteristics of MOS transistor 300.

In the transistor manufacturing method of the embodiment, however, silicon oxide film 302 cannot be formed to be thicker than silicon oxynitride film 208 as in the aforementioned first embodiment. Therefore, it is preferable to select desired one of MOS transistor 200 of the first embodiment and the manufacturing method thereof and MOS transistor 300 of the second embodiment and the manufacturing method thereof in consideration of various conditions when products are actually manufactured.

The nitride insulating film in the present invention may be any insulating film containing nitrogen, for example a silicon nitride film or a silicon oxynitride film, but is not limited thereto. The oxide insulating film may be any insulating film which contains oxygen and no nitrogen, for example a silicon thermal oxidation film or a silicon oxide film, but is not limited thereto.

In the present invention, the central portion of the gate insulating film is disposed on the channel area of the silicon substrate and both end portions thereof are disposed on the source/drain areas, and the central portion of the gate insulating film is formed of a nitride insulating film and both end portions thereof are each formed of an oxide insulating film. Ideally, it is preferable that only the nitride insulating film of the gate insulating film is present on the channel area of the silicon substrate, and only the oxide insulating film is present on each of the source/drain areas. An actual MOS transistor, however, has manufacturing errors such as tolerances. Thus, an oxide insulating film of a gate insulating film partially located on a channel area of a silicon substrate or an oxide insulating film partially located on source/drain areas falls within the scope of a MOS transistor of the present invention.

In addition, lightly doped source/drain areas of LDD structure referred to in the present invention may be any paired lightly doped source/drain areas opposite to each other through a channel area on the inner sides of deeply doped source/drain areas, and a so-called extension area may be used.

While preferred embodiments of the present invention have been described using specific terms, such description is for illustrative purposes only, and it is to be understood that changes and variations may be made without departing from the spirit or scope of the following claims.

What is claimed is:

1. A method of manufacturing a MOS transistor of LDD structure, comprising:

forming a nitride insulating film on a surface of silicon substrate;

forming a gate electrode in a predetermined pattern on a surface of said nitride insulating film;

performing wet etching of said nitride insulating film with said gate electrode used as a mask;

forming an oxide insulating film thicker than said nitride insulating film under each of both end portions of said gate electrode where said nitride insulating film is removed;

forming lightly doped source/drain area in surface portions of said silicon substrate with said gate electrode used as a mask;

forming sidewalls on said lightly doped source/drain areas; and forming deeply doped source/drain areas in surface portions of said silicon substrate with said sidewalls used as masks.

2. The method of manufacturing a MOS transistor of LDD structure according to claim 1, wherein said performing wet etching removes a portion of said nitride insulating film not masked by said gate electrode and removes portions of said nitride insulating film under both end portions of said gate electrode.

3. The method of manufacturing a MOS transistor of LDD structure according to claim 2, wherein said nitride insulating film comprises a silicon oxynitride film, and said oxide insulating film comprises a silicon thermal oxidation film formed through thermal oxidation.

4. The method of manufacturing a MOS transistor of LDD structure according to claim 1, wherein said nitride insulating film is comprises a silicon oxynitride film, and said oxide insulating film comprises a silicon thermal oxidation film formed through thermal oxidation.

5. A method of manufacturing a MOS transistor of LDD structure, comprising:

forming a nitride insulating film on a surface of silicon substrate;

forming a gate electrode in a predetermined pattern on a surface of said nitride insulating film;

performing wet etching of said nitride insulating film with said gate electrode used as a mask;

forming lightly doped source/drain areas in surface portions of said silicon substrate with said gate electrode used as a mask;

forming sidewalls on said source/drain areas an oxide insulating film integrally with said sidewalls under each of both end portions of said gate electrode where said nitride insulating film is removed by a CVD (Chemical Vapor Deposition) method; and forming deeply doped source/drain areas in surface portions of said silicon substrate with said sidewalls used as masks.

6. The method of manufacturing a MOS transistor of LDD structure according to claim 5, wherein said performing wet etching removes a portion of said nitride insulating film not masked by said gate electrode and removes portions of said nitride insulating film under both end portions of said gate electrode.

7. The method of manufacturing a MOS transistor of LDD structure according to claim 6, wherein said nitride insulating film comprises a silicon oxynitride film, and said oxide insulating film comprises a silicon oxide film.

8. The method of manufacturing a MOS transistor of LDD structure according to claim 5, wherein said nitride insulating film comprises a silicon oxynitride film, and said oxide insulating film comprises a silicon oxide film.

* * * * *